US010896273B2

(12) United States Patent
Schumann et al.

(10) Patent No.: US 10,896,273 B2
(45) Date of Patent: Jan. 19, 2021

(54) PRECISE VERIFICATION OF A LOGIC PROBLEM ON A SIMULATION ACCELERATOR

(71) Applicant: International Business Machines Corporation, Armonk, NY (US)

(72) Inventors: John A. Schumann, Austin, TX (US); Debapriya Chatterjee, Austin, TX (US); Bryant Cockcroft, Austin, TX (US); Kevin Barnett, Austin, TX (US); Piriya K. Hall, Austin, TX (US); Paul Umbarger, Austin, TX (US); Karen Yokum, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 155 days.

(21) Appl. No.: 16/158,468

(22) Filed: Oct. 12, 2018

(65) Prior Publication Data

US 2020/0117766 A1 Apr. 16, 2020

(51) Int. Cl.
*G06F 30/33* (2020.01)
*G01R 31/317* (2006.01)
*G01R 31/3177* (2006.01)

(52) U.S. Cl.
CPC ......... *G06F 30/33* (2020.01); *G01R 31/3177* (2013.01); *G01R 31/31704* (2013.01); *G01R 31/31705* (2013.01)

(58) Field of Classification Search
CPC ....................................................... G06F 30/33
USPC ........................................ 714/724, 725, 723
See application file for complete search history.

(56) References Cited

U.S. PATENT DOCUMENTS

| 5,513,339 | A  | * | 4/1996  | Agrawal ............... G06F 11/261 703/15 |
| 6,651,225 | B1 |   | 11/2003 | Lin et al. |
| 8,397,220 | B1 |   | 3/2013  | Philipp et al. |
| 9,195,784 | B2 |   | 11/2015 | Tseng et al. |
| 9,317,636 | B1 |   | 4/2016  | Petras et al. |
| 9,432,298 | B1 | * | 8/2016  | Smith ................ H04L 49/9057 |
| 2014/0192583 | A1 | * | 7/2014  | Rajan ....................... G11C 5/06 365/63 |
| 2015/0355997 | A1 |   | 12/2015 | Wall et al. |
| 2017/0074932 | A1 |   | 3/2017  | Kourfali et al. |

FOREIGN PATENT DOCUMENTS

EP          0442277 A2    8/1991

OTHER PUBLICATIONS

Vivado Design Suite User Guide: Programming and Debugging, XILINX, UG908 (v2018.2) Jun. 6, 2018; https://www.xilinx.com/support/documentation/sw_manuals/xilinx2018_2/ug908-vivado-programming-debugging.pdf; pp. 258-264.

* cited by examiner

*Primary Examiner* — Fritz Alphonse
(74) *Attorney, Agent, or Firm* — Cantor Colburn LLP; Bryan Bortnick

(57) ABSTRACT

A computer system includes a hardware accelerator and host processor. The hardware accelerator executes a simulation of a first logical model according to a plurality of simulation cycles. The host processor determines a fault checkpoint based on a logic fault that occurs in response to executing the simulation. The host processor verifies removal of the logic fault based on rerunning the simulation from the fault checkpoint.

20 Claims, 7 Drawing Sheets

PRECISE VERIFICATION OF A LOGIC PROBLEM ON A SIMULATION ACCELERATOR

BACKGROUND

The invention relates generally to digital computing systems, and more particularly, to hardware accelerator design and fabrication.

Hardware accelerators include complex circuits and digital logic that require extensive testing and simulation before actually committing to the manufacture of a production run of chip or circuit devices. Furthermore, as the complexity of a circuit chip and programmable logic devices increases along with the density of circuit devices on the chip, it is necessary to simulate the operation of these devices under a large number of possible operating conditions. Simulation accelerators, for example, may require a simulation under billions of cycles. As a result, it may take days to ensure the digital logic operates as expected.

When performing a simulation, logic faults (sometimes referred to logic bugs) can be discovered. In some instances, however, it is possible that there may only ever be a single occurrence of a detected logic fault. Debugging operations such as changing the logic model or operating the processor in a different mode can be performed with the aim of resolving the logic fault. This introduces a new issue, however, in that the logic fault may not be repeated even though it remains within the model or code. For example, the repeated simulation may now run according to the logic fix or new mode which may change how the processor runs in the cycles before the previously detected logic fault reoccurs. Therefore, it may be difficult to determine whether the debugging methods successfully removed the logic fault.

SUMMARY

According to a non-limiting embodiment, a digital computing system is configured to verify a logic fault of a simulation accelerator. The system includes a hardware accelerator and host processor. The hardware accelerator executes a simulation of a first logical model according to a plurality of simulation cycles. The host processor determines a fault checkpoint based on a logic fault that occurs in response to executing the simulation. The host processor verifies removal of the logic fault based on rerunning the simulation from the fault checkpoint.

According to another non-limiting embodiment, a method is provided for verifying a logic fault of a simulation accelerator. The method comprises executing, via the accelerator, a simulation of a first logical model according to a plurality of simulation cycles, and determining, via a host processor, a fault checkpoint based on a logic fault that occurs in response to executing the simulation. The method further comprises verifying, via the host processor, removal of the logic fault based on rerunning the simulation from the fault checkpoint.

According to still another non-limiting embodiment, a computer program product is provided. The computer program product includes a computer readable storage medium having program instructions embodied therewith. The program instructions are executable by a computer processor to cause the computer processor to perform a method of verifying a logic fault of a simulation accelerator. The method includes executing, via the accelerator, a simulation of a first logical model according to a plurality of simulation cycles, and determining, via a host processor, a fault checkpoint based on a logic fault that occurs in response to executing the simulation. The method further comprises verifying, via the host processor, removal of the logic fault based on rerunning the simulation from the fault checkpoint.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings, in which:

DETAILED DESCRIPTION

Figure 1:
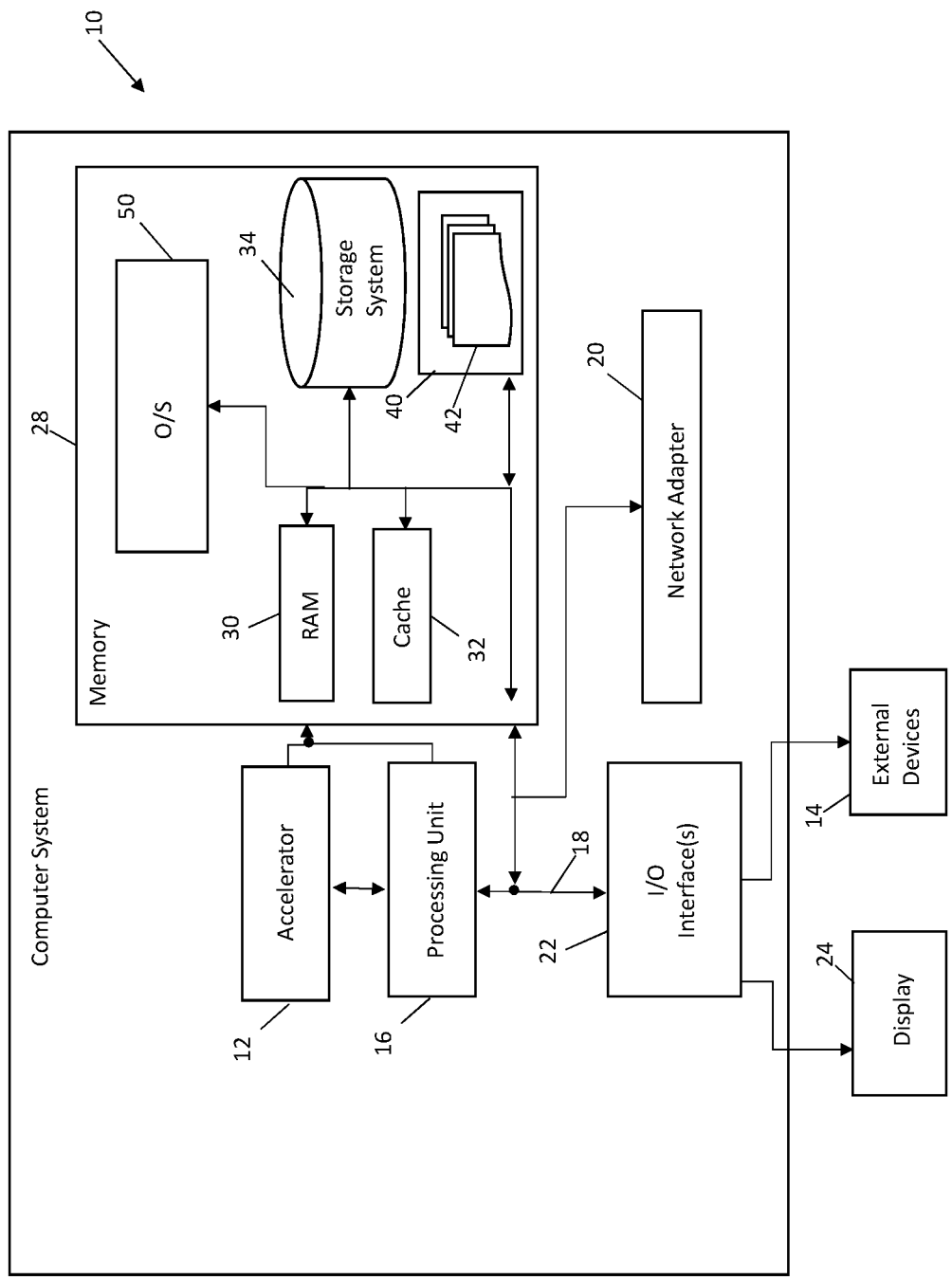
FIG. 1 is a block diagram illustrating a computer system which is capable of verifying a logic fault of a simulation accelerator in accordance with various non-limiting embodiments of the invention.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

As described herein, one or more embodiments provide a logic fault verification system configured to verify logic faults of a simulation accelerator using a reduced number of simulation cycles. Unlike conventional systems that require execution of excessive cycles (e.g., billions of cycles) due to repeating the simulation to verify the existence of a previously detected logic fault, at least one embodiment described herein provides a logic fault controller that initiates a fail-state interrupt in the simulation without losing the preconditions that caused the logic fault. In at least one embodiment, the logic controller monitors the results occurring during each cycle of a simulation, initiates the fail-state interrupt to stop the simulation in response to detecting a logic fault, generates a fault checkpoint at a predetermined number of cycles preceding the detected logic fault, and then performs a diagnostic operation beginning at the fault checkpoint to verify whether a fault removal operation successfully removed the previously detected logic fault.

Therefore, instead of re-executing an excessive amount of simulation cycles (e.g., billions of cycles) following detection of a logic fault, the simulation can be re-executed starting from the fault checkpoint which is generated a set number of cycles before the cycle containing the detected logic fault. In one or more embodiments, the set number of cycles can be changed on a case-by-case basis. The fault checkpoint can then be used as the starting point of diagnosing the debugging operation used to remove the logic fault. The debugging operations can include, for example, a logic fix or a mode change.

A mode change involves loading the fault checkpoint into the same model that produced the logic fail. Before clocking the model, the mode change is made in the model. This is done by setting the appropriate bits in the logic via the interface to the simulation accelerator. After performing the mode change the model is clocked, and a trace is taken. The trace can be analyzed by the logic fault controller to monitor the mode change in action. The logic fault controller can further analyze the clocked model to ensure that the processor is operating normally.

A logic change involves loading the fault checkpoint onto a new model that contains the logic fix. After it is loaded, the new model is clocked and a trace is taken. The trace can be analyzed by the logic fault controller and the new model clocked to ensure that the logic fault has been removed from the new model. In either case, the logic fault verification system described herein is capable of precisely verifying whether a rarely occurring logic fault has been removed from a simulation using significantly less cycles and processing time than required by conventional fault verification systems.

Referring now to FIG. 1, a computer system 10 capable of verifying a logic fault of a simulation accelerator is illustrated according to a non-limiting embodiment. As shown in FIG. 1, computer system 10 is shown in the form of a general-purpose computing device, also referred to as a processing device. The components of computer system 10 may include, but are not limited to, one or more accelerators 12, one or more processors 16, system memory 28, and a bus 18 that couples various system components.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include an operating system (OS) 50, along with computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include a library API (not shown in FIG. 1). The library API is a software library comprising APIs for performing the data manipulation functions provided by the specialized hardware devices such as, for example, the accelerator 12 is sometimes referred to as a "co-processors" and typically performs a dedicated computing function including, but not limited to, CPU processes, cryptographic operations and calculations, encoding/decoding processes, and network operations. By off-loading a particular computing function to a dedicated accelerator, the overall computing speed of the computing system can be increased.

The storage system 34 can store a basic input output system (BIOS). The BIOS is a set of essential routines that initialize and test hardware at startup, start execution of the OS 50, and support the transfer of data among the hardware devices. When the computer system 10 is in operation, the processor 16 is configured to execute instructions stored within the storage system 34, to communicate data to and from the memory 28, and to generally control operations of the computer system 10 pursuant to the instructions.

The accelerator 12 is in signal communication with the processor 16 along with the system memory 28 and can operate as a hardware accelerator. The accelerator 12 can apply various computing operations including, but not limited to, compression algorithms or decompression algorithms, sometimes referred to as hardware compressions or hardware decompressions, to data or data streams requested by an application, sometimes referred to as a "process" or "thread". Various lossless compression algorithms, for example, can be executed by the accelerator to reduce the size of data or a data stream requested by an application. Although the application is described herein in terms of issuing compression requests, the application is not limited thereto and can apply in a similar manner to decompression requests.

Program/utility 40, having a set (at least one) of program modules 42, may be stored in memory 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, one or more devices that enable a user to interact with computer system/server 10, and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Figure 2:
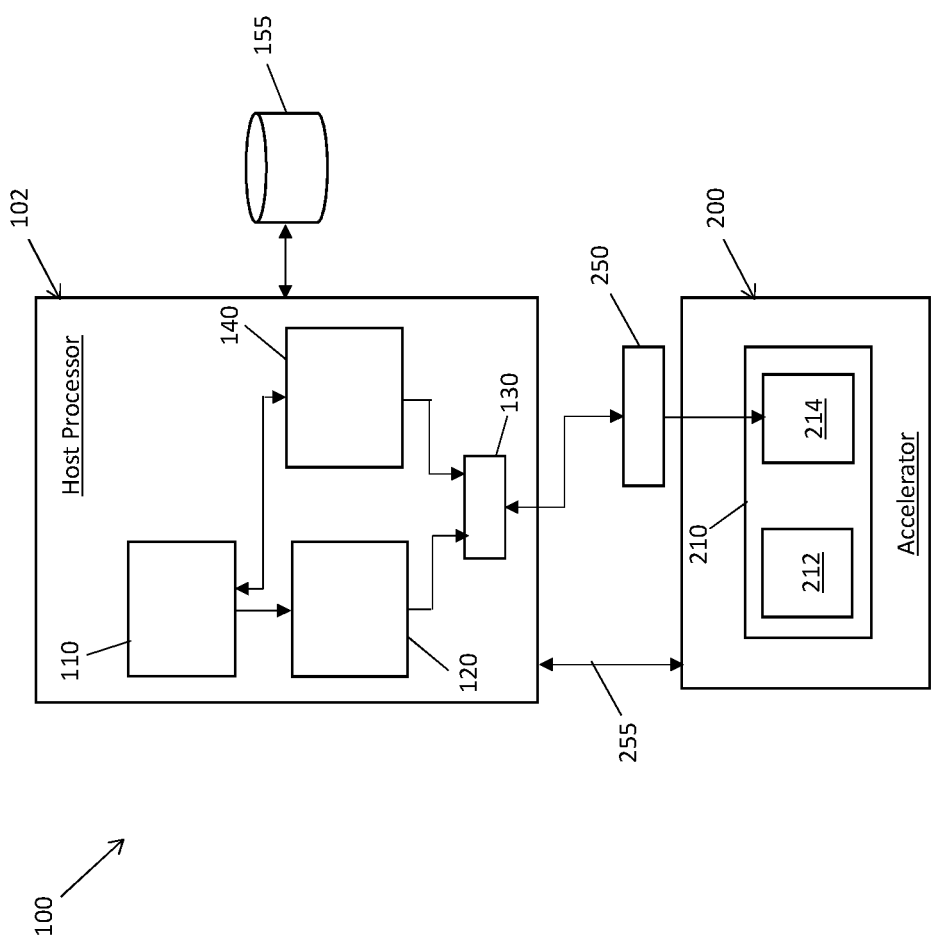
FIG. 2 is a block diagram illustrating a logic fault verification system according to a non-limiting embodiment.

FIG. 2 illustrates a logic fault verification system 100 according to a non-limiting embodiment. The logic fault verification system 100 includes a host processor 102 in signal communication with hardware accelerator 200 through channel interface 250. In at least one embodiment, the hardware accelerator is a simulation accelerator, which can simulate test models stored in a memory unit 155. The channel interface 250 is utilized to transfer test cases to a model 210 generator which provides a model 212 to be simulated. The channel interface 250 also is configured to return model status and simulation results to the host processor 102. A second communications link 255 in signal communication with the accelerator 200 can also be implemented, which provides start, stop and transmit signals. These signals start the operation of the accelerator 200 from a given state as specified in storage unit 214 to simulate the CPU model 212 supported by the model generator 210. When it is desired to interrupt the operation of the accelerator 200, as for example to prepare for the transmission of resultant data, a stop signal can be sent to accelerator 200. Additionally, a transmit signal can be supplied to the accelerator 200 to cause information in storage 214 to be passed to host processor 102 through channel interface 250.

In order to drive the CPU model 212 and the hardware accelerator 200, instruction streams are loaded into the storage unit 214. These streams are created by a host program that operates under parametric control of the model generator 210 to allow a sequence of operations indicated within the stream to bypass or to concentrate on specific segments of the machine being modeled. Once initiating the simulation of the test streams within the model, the logic fault controller 110 monitors the results occurring during each cycle of the simulation. The simulation monitoring process can result in the detection of a logic problem, e.g., a logic fault occurring during a given simulation cycle. In one or more embodiments, the logic fault controller 110 can initiate a fail-state interrupt to stop the simulation in response to detecting a logic fault, generates a fault checkpoint at a predetermined number of simulation cycles preceding the faulty cycle containing the logic fault, and then perform a diagnostic operation which begins at the fault checkpoint to verify whether a fault removal operation successfully removed the previously detected logic fault. The operation of the logic fault controller 110 is described in greater detail below.

In a typical interaction with the system shown in FIG. 2, a job is initiated, which defines a model to be simulated and the length of the simulation run. The logic fault controller 110 can generate the job, and generate a test case of different lengths. These test cases are stored in queue 120 under host control. At appropriate times, the model driver 210 signals that the simulation needs work. This condition can occur, for example, when all test cases presently loaded within the model have reached either a termination or suspension state. When this event occurs, the model generator 210 interrupts the host processor 102, which in turn halts the accelerator 200.

Once halted, a host program MAPPER 130 extracts the resultant data for the test cases that are terminated or completed, returning it to queue 140 for checking by the logic fault controller 110. MAPPER program 130 then loads the new input queue element from queue 120 into the accelerator 200 and restarts the simulation so that it operates against the established queue in the host processor 102. This sequence continues until user run criteria are attained, a model error is detected, a logic fault is detected, and/or a simulation miscompare is discovered. Throughout the operation, a record is made of all occurring transmissions and logic states with periodic model checkpoints being taken during the simulation.

Figure 3:
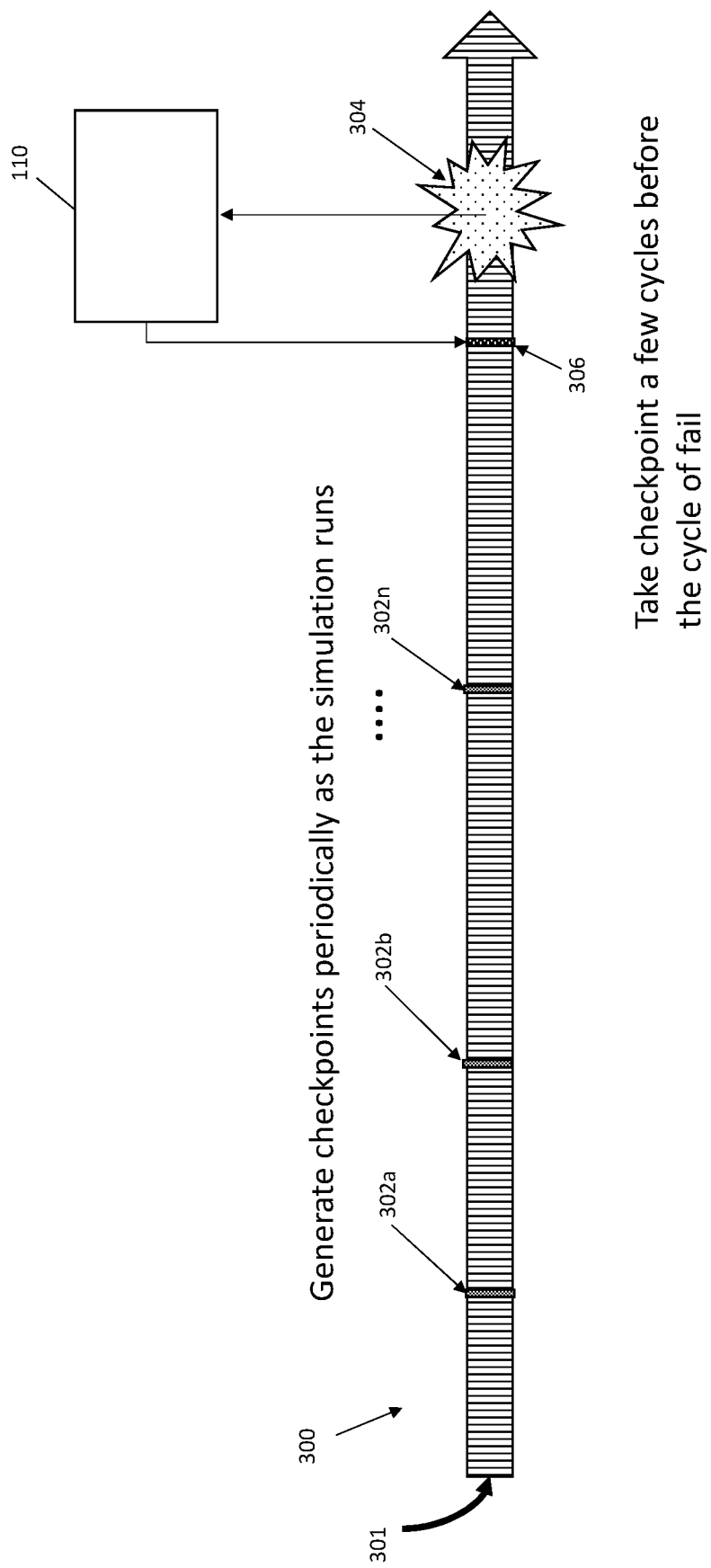
FIG. 3 illustrates a logic fault controller generating a fault checkpoint following detection of a logic fault included in a simulation performed by a logic fault verification system according to a non-limiting embodiment.

FIG. 3 illustrates the operation of the logic fault controller 110 according to a non-limiting embodiment. The logic fault controller 110 initiates a simulation 300 at the simulation's start cycle 301 and monitors each simulation cycle as the simulation runs. During the course of the simulation 300, the logic fault controller 110 can periodically generate one or more logic state checkpoints 302a, 302b, 302n. The logic checkpoints 302a, 302b, 302n are generated according to a set time period (e.g., every 5 mins) or after completing a set number of cycles (e.g., every one-thousand cycles). A checkpoint 302a, 302b, 302n contains the internal and observable logic state of the microprocessor and memory to that point (i.e., cycle) in the simulation 300. While monitoring the simulation 300, the logic fault controller 110 may detect a logic fault 304 at a given simulation cycle. Because the logic fault controller 110 analyzes the traces of each individual cycle, the precise cycle containing the logic fault 304 (i.e., the faulty cycle) can be determined.

In response to detecting the logic fault 304, the logic fault controller 110 generates a fault checkpoint 306 into the simulation 300. In at least one embodiment, the logic fault controller 100 generates the fault checkpoint 306 a predetermined number of cycles (e.g., 1 to 10 cycles) preceding the cycle containing the detected logic fault 304. That is, unlike the logic checkpoints 302a, 302b, 302n which are generated according to a pre-set or predetermined scheme, the fault checkpoint 306 is generated into the simulation 300 in response to detecting the logic fault 304. Furthermore, because the precise cycle of the logic fault 304 is known, the logic fault controller 110 can select a specific preceding cycle at which to generate the fault checkpoint 306. Therefore, the logic fault controller 110 can re-execute the simulation 300 starting from the fault checkpoint 306 that is generated close to, or even immediately preceding the logic fault 304 (i.e., one cycle away), instead of restarting the simulation from the initial start cycle 301 or from a logic checkpoint 302n which may possibly be located millions of cycles away from the logic fault 304.

After detecting the logic fault 304, a debugging operation can be performed which aims to remove the logic fault 304 from the simulation 300. Various debugging operations can be employed such as, for example, changing the logic model (sometimes referred to as a "logic fix") or operating the processor in a different mode (sometimes referred to a "mode change") can be performed with the aim of resolving the logic fault.

Figure 4A:
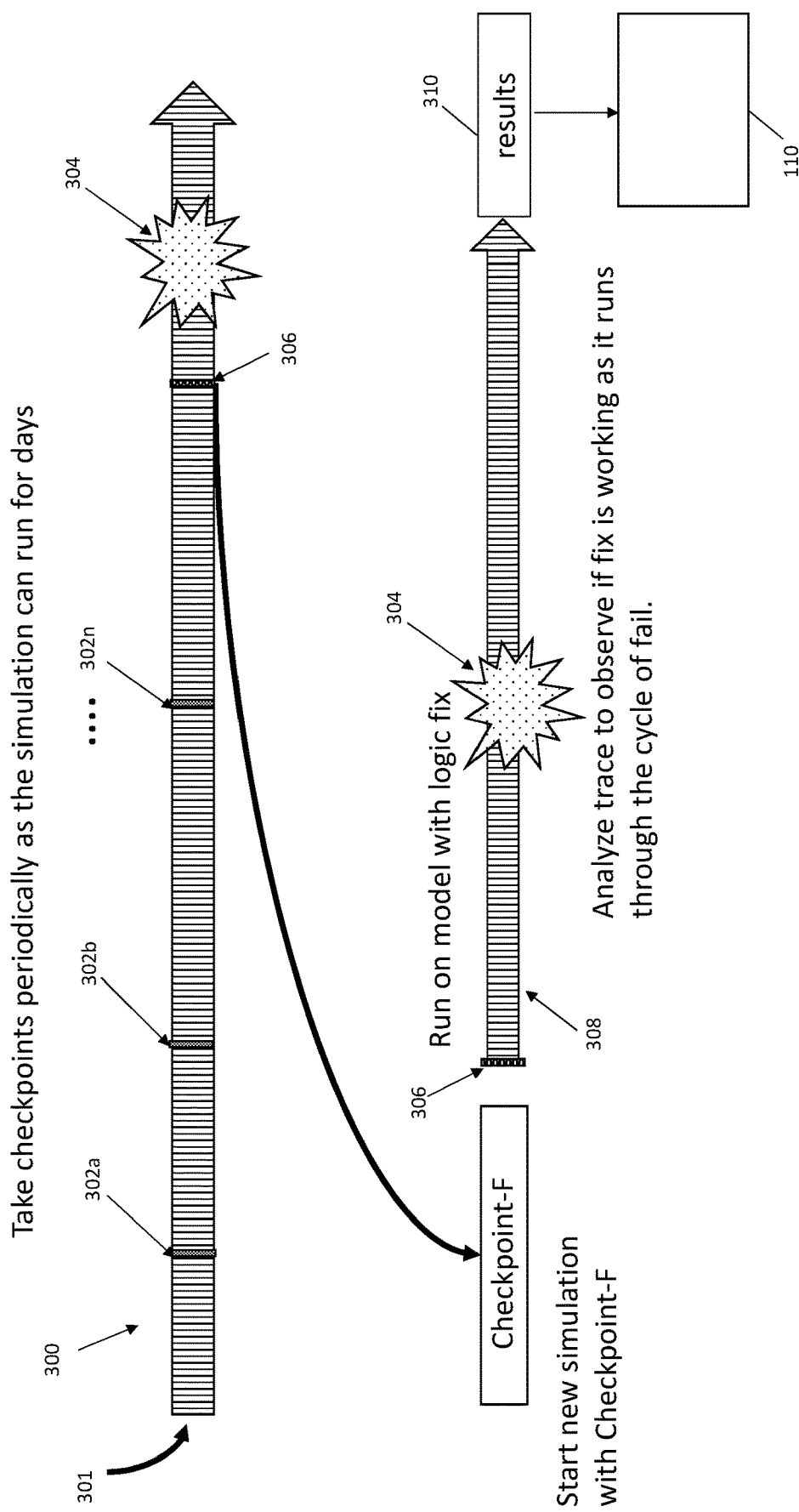
FIG. 4A illustrates a logic fault controller performing a model replacement diagnostic operation to verify removal of a previously detected logic fault according to a non-limiting embodiment.

Referring to FIG. 4A, a logic fix debugging operation is illustrated according to a non-limiting embodiment. The logic fix involves loading the fault checkpoint 306 onto an entirely new model or new simulation 308 that contains the logic fix, e.g., code added to the new model 308 aimed to specifically correct the previously detected logic fault 304. After it is loaded, the new model simulation 308 is re-executed starting from the fault checkpoint 306, and clock and trace results 310 are obtained by the logic fault controller 110. The clock and trace results 310 are then analyzed by the logic fault controller 110 and compared to expected results (e.g., stored in memory of the logic fault controller 110) to ensure that the previously detected logic fault 304 has been removed from the new model simulation 308.

Figure 4B:
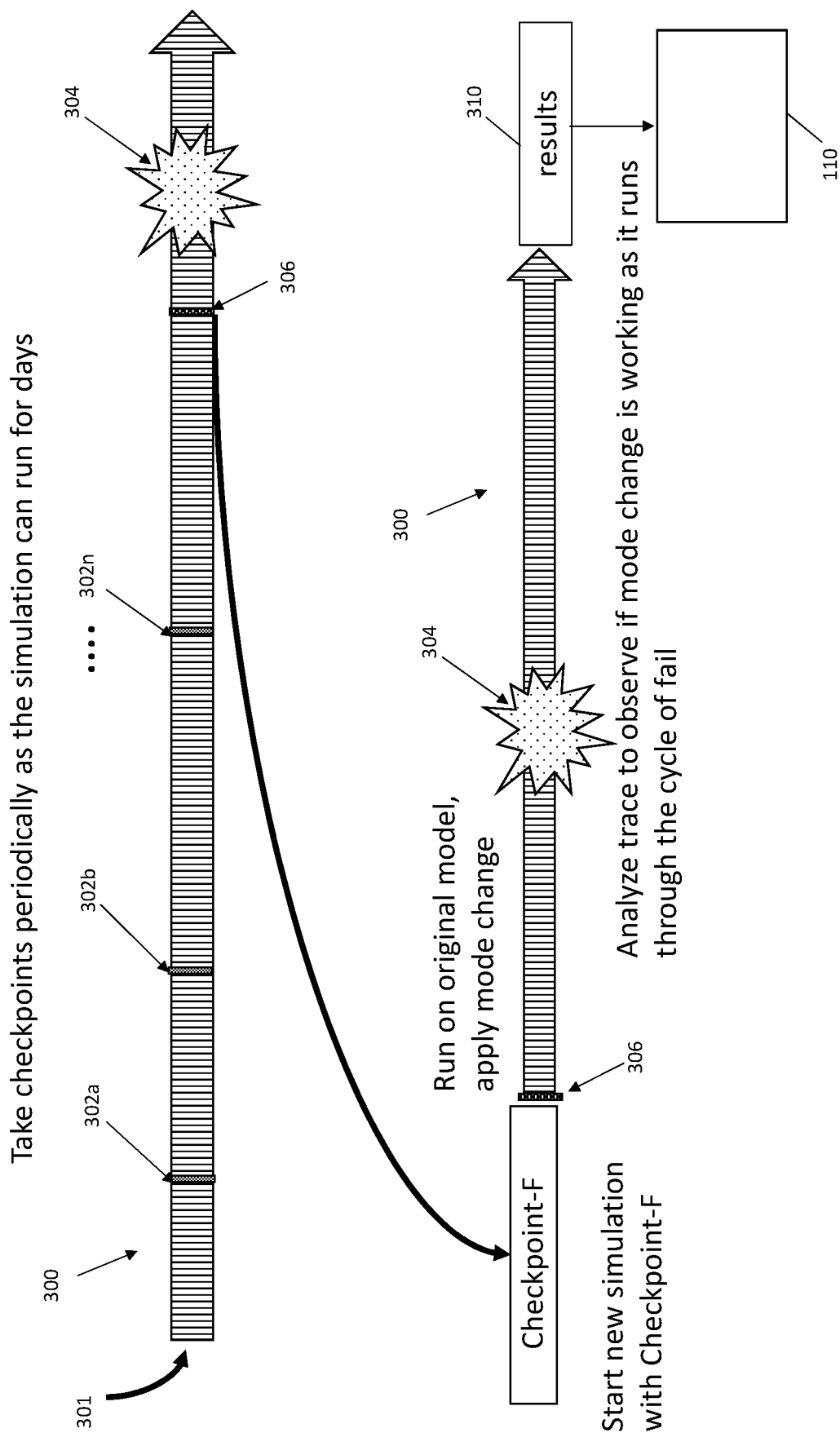
FIG. 4B illustrates a logic fault controller performing a mode change diagnostic operation to verify removal of a previously detected logic fault according to a non-limiting embodiment.

Referring to FIG. 4B, a mode change debugging operation is illustrated according to a non-limiting embodiment. The mode change involves loading the fault checkpoint 306 the same model simulation 300 that produced the logic fault 304. Before re-clocking the model simulation 300, a mode change of the accelerator is established. The logic fault controller 110 can establish the mode change by setting the appropriate bits in the logic via the channel interface 250 to the simulation accelerator 200 (see FIG. 2). After establishing the mode change, the model simulation 300 is clocked and a trace is taken. The clock and trace results 310 can be analyzed by the logic fault controller 110 to monitor the mode change in action. In other words, the model simulation 300 can be re-executed starting from the fault checkpoint 306, and the operation of the accelerator corresponding to the mode change can be monitored by the logic fault controller 110.

Various technical benefits are achieved using the system and methods described herein, including the capability of significantly reducing processing time and processing power necessary to verify and remove logic faults of a simulation accelerator. For instance, the simulation can be re-executed starting from the fault checkpoint which is generated a set number of cycles before the cycle containing the detected logic fault, as opposed to conventional checkpoints generated independently from a detected logic fault. In one or more embodiments, the set number of cycles can be changed on a case-by-case basis. Re-executing the simulation from the fault checkpoint ensures the logic fault will be repeated if the debugging operation fails. In this manner, excessive simulation cycles can be avoided while ensuring a sporadically occurring logic fault can be tracked and removed. Accordingly, the functionality, precision, and quality of an accelerator is improved because it does not contain isolated or sporadically occurring logic faults that cannot be subsequently located using conventional logic fault verification schemes.

Figure 5:
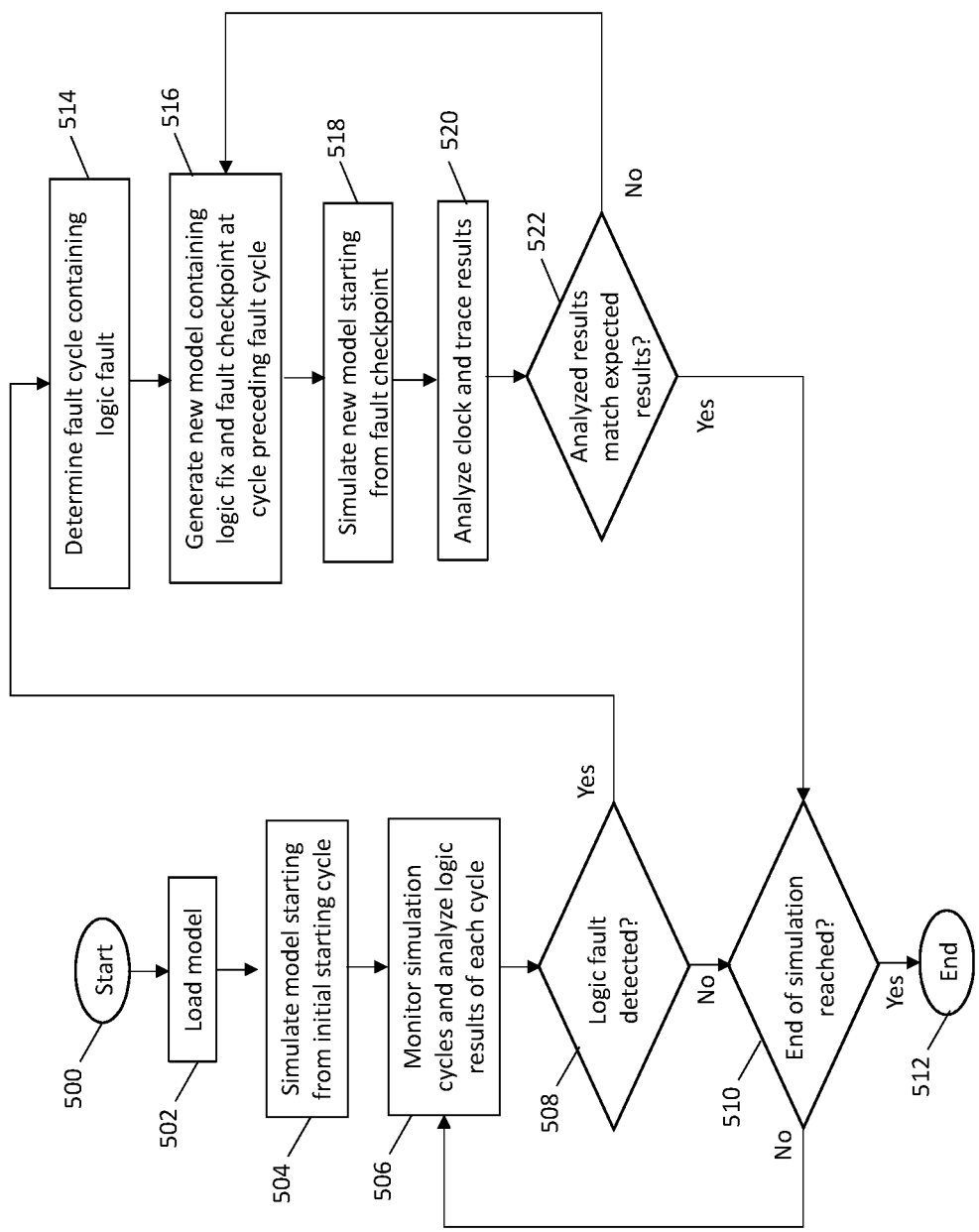
FIG. 5 is a flow diagram illustrating a method of verifying a logic fault of a simulation accelerator according to a non-limiting embodiment.

Turning now to FIG. 5, a method of verifying a logic fault of a simulation accelerator based on a logic fix debugging operation is illustrated according to a non-limiting embodiment. The method begins at operation 500, and at operation 502 a model is loaded into the system. At operation 504, the model is simulated starting from an initial starting cycle. At operation 506, each cycle of the simulation is monitored and the logic results of each cycle is analyzed. At operation 508, a determination is made as to whether a logic fault is detected at a given cycle. When a logic fault is not detected, the method proceeds to operation 510 to determine whether the end of the simulation has been reached. When the end of the simulation has been reached, the method ends at operation 512. Otherwise, the method returns to operation 506 and continues monitoring the cycles of the simulation.

When, however, a logic fault is detected at operation 508, the specific cycle containing the logic fault is determined at operation 514. At operation 516, a new model is generated. The new model contains a logic fix aimed at removing the detected logic fault. A fault checkpoint is also added to the new model. The fault checkpoint is input at a cycle preceding the faulty cycle (i.e., the specific cycle previously identified to contain the logic fault). At operation 518, the new model is simulated starting from the fault checkpoint, and at operation 520 the clock and trace results are analyzed. At operation 522, a determination is made as to whether the analyzed results produced from the new model match the expected results. When the analyzed results match the expected results, the model proceeds to operation 510 and a determination is made as to whether the simulation has reached its end. When, however, the analyzed results do not match the expected results, the method returns to operation 516 and a new model is generated with the aim of removing the logic fault. The operations of the method described above can be continuously repeated until the simulation reaches its end without incurring a logic fault.

Figure 6:
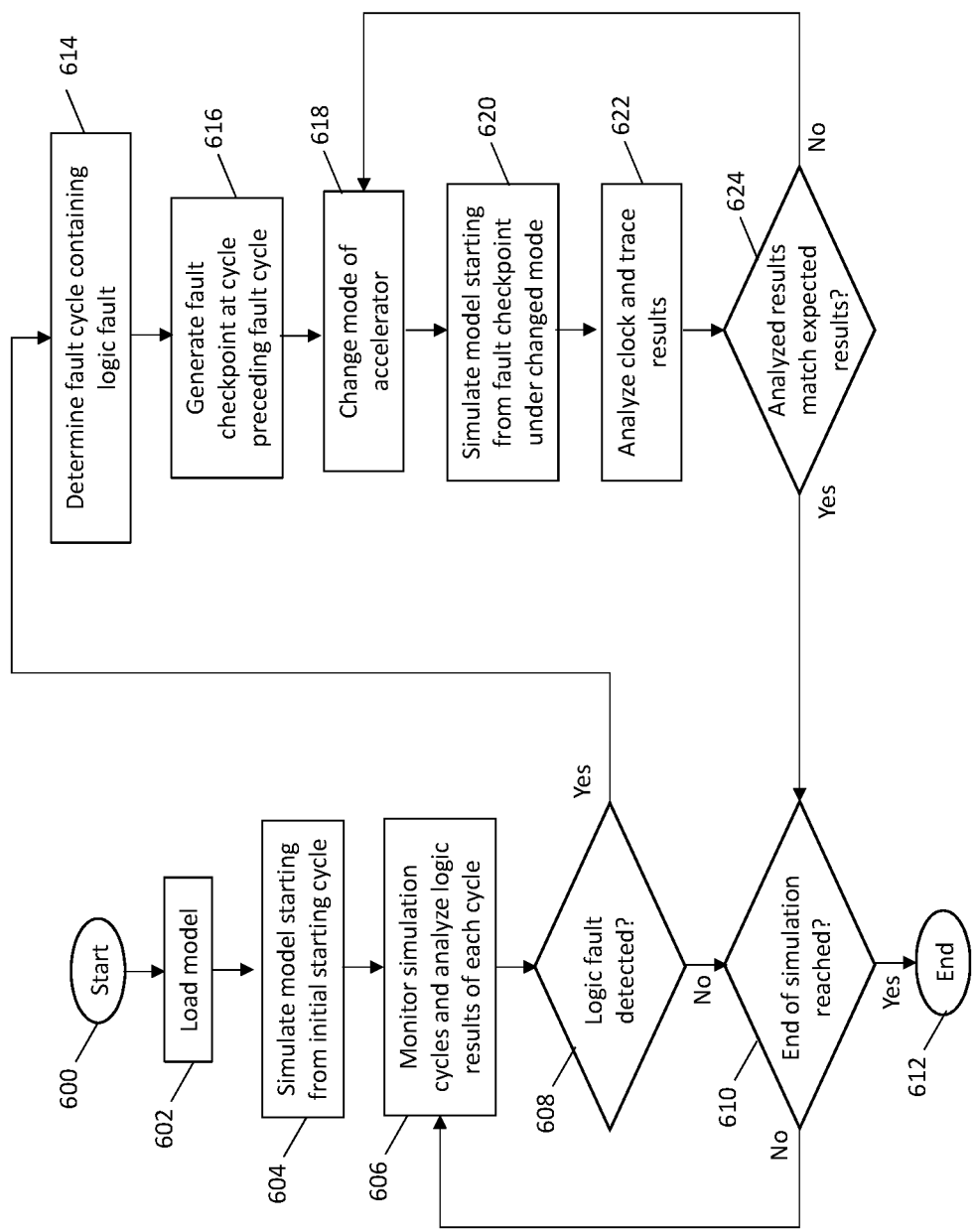
FIG. 6 is a flow diagram illustrating a method of verifying a logic fault of a simulation accelerator according to a non-limiting embodiment.

With reference to FIG. 6, a method of verifying a logic fault of a simulation accelerator based on a mode change debugging operation is illustrated according to a non-limiting embodiment. The method begins at operation 600, and at operation 602 a model is loaded into the system. At operation 604, the model is simulated starting from an initial starting cycle. At operation 606, each cycle of the simulation is monitored and the logic results of each cycle is analyzed. At operation 608, a determination is made as to whether a logic fault is detected at a given cycle. When a logic fault is not detected, the method proceeds to operation 610 to determine whether the end of the simulation has been reached. When the end of the simulation has been reached, the method ends at operation 612. Otherwise, the method returns to operation 606 and continues monitoring the cycles of the simulation.

When, however, a logic fault is detected at operation 608, the specific cycle containing the logic fault is determined at operation 614. At operation 616, a fault checkpoint is generated at cycle preceding the faulty cycle (i.e., the specific cycle previously identified to contain the logic fault). At operation 618 the mode is changed and at operation 620 the model is again simulated, but is started from the fault checkpoint.

At operation 622 the clock and trace results are analyzed, and at operation 624 a determination is made as to whether the analyzed results produced from the new model match the expected results. When the analyzed results match the expected results, the model proceeds to operation 610 and a determination is made as to whether the simulation has reached its end. When, however, the analyzed results do not match the expected results, the method returns to operation 618 and the mode is again changed. The operations of the method described above can be continuously repeated until the simulation reaches its end without incurring a logic fault.

The operations of the method described above can be continuously repeated until the simulation reaches its end without incurring a logic fault.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer system comprising:
    a hardware accelerator configured to execute a simulation of a first logical model according to a plurality of simulation cycles; and
    a host processor configured to determine a fault checkpoint based on a logic fault that occurs in response to executing the simulation,
    wherein the host processor verifies removal of the logic fault based on rerunning the simulation from the fault checkpoint.

2. The computer system of claim 1, wherein the host processor determines a preceding cycle among the simulation cycles at which to generate the fault checkpoint based on a faulty cycle among the simulation cycles, the faulty cycle containing the logic fault.

3. The computer system of claim 2, wherein the host processor includes a logic fault controller that determines the preceding cycle by subtracting a predetermined number of simulation cycles from the faulty cycle.

4. The computer system of claim 2, wherein the host processor performs a debugging operation to remove the logic fault based on the fault checkpoint.

5. The computer system of claim 4, wherein the debugging operation includes at least one of a logic fix debugging operation and a mode change debugging operation.

6. The computer system of claim 5, wherein the logic fix debugging operation includes generating a new logical model and fault checkpoint generated in that new logical model at a simulation cycle that matches the preceding cycle included in the first logical model, and rerunning the simulation of the new logical model starting from the fault checkpoint.

7. The computer system of claim 5, wherein the mode change debugging operation includes generating the fault checkpoint at the preceding cycle included in the first model, and rerunning the simulation of the first logical model starting from the fault checkpoint according to a changed mode of the accelerator.

8. A method of verifying a logic fault in an accelerator, the method comprising:
    executing, via the accelerator, a simulation of a first logical model according to a plurality of simulation cycles;
    determining, via a host processor, a fault checkpoint based on a logic fault that occurs in response to executing the simulation; and
    verifying, via the host processor, removal of the logic fault based on rerunning the simulation from the fault checkpoint.

9. The method of claim 8, further comprising determining, via the host processor, a preceding cycle among the simulation cycles at which to generate the fault checkpoint based on a faulty cycle that contains the logic fault.

10. The method of claim 9, further comprising determining, via a logic fault controller included in the host processor, the preceding cycle by subtracting a predetermined number of simulation cycles from the faulty cycle.

11. The method of claim 9, further comprising performing a debugging operation to remove the logic fault based on the fault checkpoint.

12. The method of claim 11, wherein the debugging operation includes at least one of a logic fix debugging operation and a mode change debugging operation.

13. The method of claim 12, wherein performing the logic fix debugging operation includes:
    generating a new logical model and fault checkpoint generated in that new logical model at a simulation cycle that matches the preceding cycle included in the first logical model; and
    rerunning the simulation of the new logical model starting from the fault checkpoint.

14. The method of claim 12, wherein performing the mode change debugging operation includes:
    generating the fault checkpoint at the preceding cycle included in the first model; and
    rerunning the simulation of the first logical model starting from the fault checkpoint according to a changed mode of the accelerator.

15. A computer program product comprising a computer readable storage medium having program instructions embodied therewith the program instructions executable by a computer processor to cause the computer processor to perform a method of verifying a logic fault in an accelerator, the method comprising:
    executing, via the accelerator, a simulation of a first logical model according to a plurality of simulation cycles;
    determining, via a host processor, a fault checkpoint based on a logic fault that occurs in response to executing the simulation; and verifying, via the host processor, removal of the logic fault based on rerunning the simulation from the fault checkpoint.

16. The computer program product of claim 15, further comprising determining, via the host processor, a preceding cycle among the simulation cycles at which to generate the fault checkpoint based on a faulty cycle that contains the logic fault.

17. The computer program product of claim 16, further comprising determining, via a logic fault controller included in the host processor, the preceding cycle by subtracting a predetermined number of simulation cycles from the faulty cycle.

18. The computer program product of claim 16, further comprising performing a debugging operation to remove the logic fault based on the fault checkpoint.

19. The computer program product of claim 18, wherein performing the debugging operation includes:
   generating a new logical model that contains the fault checkpoint at a simulation cycle that matches the preceding cycle included in the first logical model; and
   rerunning the simulation of the new logical model starting from the fault checkpoint.

20. The computer program product of claim 18, wherein performing the debugging operation includes:
   generating the fault checkpoint at the preceding cycle included in the first model; and
   rerunning the simulation of the first logical model starting from the fault checkpoint according to a changed mode of the accelerator.

* * * * *